(12) United States Patent
Cima

(10) Patent No.: US 11,543,437 B2
(45) Date of Patent: Jan. 3, 2023

(54) NEEL EFFECT® ISOLATED DC/AC CURRENT SENSOR INCORPORATED IN A PCB

(71) Applicant: NEELOGY, Saint Avertin (FR)

(72) Inventor: Lionel Fabien Cima, Saint-Cyr-sur-Loire (FR)

(73) Assignee: NEELOGY, Saint Avertin (FR)

(*) Notice: Subject to any disclaimer, the term of this patent is extended or adjusted under 35 U.S.C. 154(b) by 654 days.

(21) Appl. No.: 16/491,131

(22) PCT Filed: Mar. 5, 2018

(86) PCT No.: PCT/EP2018/055323
§ 371 (c)(1),
(2) Date: Sep. 4, 2019

(87) PCT Pub. No.: WO2018/162400
PCT Pub. Date: Sep. 13, 2018

(65) Prior Publication Data
US 2020/0011900 A1 Jan. 9, 2020

(30) Foreign Application Priority Data
Mar. 6, 2017 (FR) .................... 1751776

(51) Int. Cl.
*G01R 15/18* (2006.01)
*G01R 33/00* (2006.01)
(Continued)

(52) U.S. Cl.
CPC ....... *G01R 15/183* (2013.01); *G01R 33/0052* (2013.01); *G01R 33/04* (2013.01);
(Continued)

(58) Field of Classification Search
CPC .. G01R 15/183; G01R 15/18; G01R 33/0052; G01R 33/04; B82Y 25/00; H01F 1/0018;
(Continued)

(56) References Cited

U.S. PATENT DOCUMENTS 3,340,466 A * 9/1967 Ono .................... G01N 27/9046
324/227
3,437,810 A * 4/1969 Walters ................ G01N 27/902
250/358.1
(Continued)

FOREIGN PATENT DOCUMENTS

DE 102010014281 A1 * 10/2011 ........... H01F 27/027
FR 2984513 A1 6/2013
(Continued)

OTHER PUBLICATIONS

Translation of FR 3034526 (Year: 2016).*
(Continued)

*Primary Examiner* — Christopher P McAndrew
(74) *Attorney, Agent, or Firm* — Greer, Burns & Crain, Ltd

(57) ABSTRACT

A current sensor includes at least one primary circuit that is intended to conduct the current to be measured, and a secondary circuit containing at least four Neel-effect® transducers, each having a coil and a superparamagnetic core. The current sensor is designed on the basis of a printed circuit board, the primary circuit including at least two distinct metal tracks that are composed of one and the same metal and connected to one another by a via made of a rivet, of a tube or of an electrolytic deposit of the same metal.

17 Claims, 3 Drawing Sheets

(51) Int. Cl.
*G01R 33/04* (2006.01)
*H01F 1/00* (2006.01)
*H01F 27/28* (2006.01)
*H01F 41/04* (2006.01)

(52) U.S. Cl.
CPC ........... *H01F 1/0018* (2013.01); *H01F 27/28* (2013.01); *H01F 27/2804* (2013.01); *H01F 41/04* (2013.01)

(58) Field of Classification Search
CPC .... H01F 1/0063; H01F 27/28; H01F 27/2804; H01F 41/04; H01F 5/003
USPC .......................................................... 324/126
See application file for complete search history.

(56) References Cited

U.S. PATENT DOCUMENTS

| | | | | |
|---|---|---|---|---|
| 3,774,185 | A * | 11/1973 | Parth | G08B 21/12 137/392 |
| 4,048,558 | A * | 9/1977 | Goodman | G01R 27/02 324/609 |
| 5,864,229 | A * | 1/1999 | Lund | G01N 27/902 324/242 |
| 8,076,931 | B2 | 12/2011 | Lenglet | |
| 8,896,305 | B2 | 11/2014 | Cima et al. | |
| 2006/0113987 | A1 * | 6/2006 | Sorensen | G01R 15/18 324/117 H |
| 2007/0216408 | A1 | 9/2007 | Ando et al. | |
| 2011/0025357 | A1 * | 2/2011 | Lee | G01R 31/2889 324/754.03 |
| 2012/0139534 | A1 | 6/2012 | Storkey et al. | |
| 2018/0080961 | A1 | 3/2018 | Cima | |

FOREIGN PATENT DOCUMENTS

| | | | | |
|---|---|---|---|---|
| WO | | 2013/045778 A1 | 4/2013 | |
| WO | WO-2013045778 A1 * | | 4/2013 | ........... G01R 15/185 |

OTHER PUBLICATIONS

Translation of WO 2013045778 (Year: 2013).*
Translation of DE 102010014281 (Year: 2010).*
French Search Report from French Patent Application No. 1751776, dated Feb. 8, 2018.
International Search Report from corresponding International Patent Application No. PCT/EP2018/055323, dated May 4, 2018.
Anonymous, "Designing with Vias", Royal Circuit Solutions (2015), retrieved Feb. 2, 2018 from <www.RoyalCircuits.com>.
Gutierrez et al., "PCB Design Guidelines for 0 5mm Package-on-Package Applications Processor, Part I", Texas Instruments Incorporated—Application Report (2010), pp. 1-31.
Mleizhu et al., "Via Design in Multi-Layer PCB", Asia-Pacific Conference on Environmental Electromagnetics (2003), pp. 94-98.
Vourc'h et al., "Novel Magnetic Field and Current Sensors Based on Superparamagnetic Transducers", Sensor Letters (2009), 7(3), pp. 293-298.

* cited by examiner

FIG. 1bis

NEEL EFFECT® ISOLATED DC/AC CURRENT SENSOR INCORPORATED IN A PCB

BACKGROUND

The present invention relates to a device for measuring a magnetic field and more particularly a device for measuring direct and/or alternating currents of a primary conductor. The field of the invention is that of the measurement of magnetic fields (magnetometers) or the measurement of electric currents via the magnetic fields thereof (contactless current transducer).

In the field of DC current sensors, "shunts" are known that have great immunity to interfering currents and make it possible to measure currents accurately, but they are not naturally isolated. The use of a shunt requires isolating electronics, which is generally expensive and bulky, and not very robust in a harsh environment (in particular at high temperature). For high-voltage applications (>50V), there are solutions with optical isolation. In general the material used for measurement is a material the resistivity of which has a constant thermal drift of approximately zero (for example constantan). Sometimes copper is used directly, and it is then necessary to provide thermal drift compensation, which makes measurement more complicated and generally makes it less accurate. Among the defects of the shunt, the presence of a voltage drop and power dissipation by the Joule effect should be noted. For a 1000 A sensor there is typically a resistance of 10 µΩ and thus thermal dissipation of 10 W. One of the consequences is great difficulty in using a shunt in a compact system owing to its self-heating.

In general a shunt is also fairly bulky to allow proper thermal dissipation without exceeding its maximum temperature.

Finally, the shunt has a very limited bandwidth due to self-induction effects, except in the case of non-inductive shunts, the volumes, weight and costs of which are prohibitive apart from some very uncommon metrology applications.

The open-loop Hall Effect sensors are of low accuracy and are very sensitive to interfering currents. In order to improve their immunity, magnetic shielding is often used, which introduces additional faults: it is subject to strong magnetic remanence with time and temperature drift.

Zero-flux Hall effect sensors are accurate and are based on the use of a magnetic core, which serves as magnetic shielding and field collimator. However, they are also subject to magnetic remanence drift over time and with respect to temperature. They are also large and bulky owing to the presence of the core of magnetic material, required for channelling the magnetic flux and for shielding. The limit of operation at high temperature is often imposed by the ferromagnetic core.

Flux Gate technology is very sensitive and accurate but is extremely sensitive to cross-talk and to perturbed environments owing to the high permeability of its magnetic material. The technology then requires heavy and bulky shielding solutions in order to prevent local saturation of the transducer core under the effect of a magnetic field.

The GMR (Giant MagnetoResistance) and/or AMR (Anisotropic MagnetoResistance), or even TMR (Tunnel MagnetoResistance) technologies are relatively sensitive and accurate when they make use of the zero-flux principle. They can easily be incorporated in an integrated circuit, except for the compensating coil, which poses a problem for strong fields and therefore limits the applicable range of current. Consequently, they are relatively sensitive to cross-talk phenomena and they also display drift of their magnetic offset owing to the ferromagnetic nature of their transducer.

Fibre-optic current sensors (FOCSs) are based on the Faraday Effect. They give very good performance for measuring very high currents (up to 600 kA). They have excellent immunity to cross-talk, and excellent performance when operating at zero flux. The latter leads to high power consumption for high currents. However, FOCSs are not applicable a priori for the requirements of integration, as they are relatively bulky and necessitate surrounding the primary conductor.

Current sensors of the transformer type (of the "Rogowski" type with air core or CT with magnetic core) have relatively low sensitivity to cross-talk, but they do not allow measurement of the DC components.

Moreover, for most of the technologies used, sudden changes in primary voltage (dV/dt) cause injections of parasitic currents, which may be prohibitive at the level of the electronics of the sensor (at best saturation of the measurement stages, at worst destruction). It is particularly sensitive in the case of the shunt. Certain technologies such as the transformer (CT, Rogowski or Hall or Flux Gate) allow the use of an electrostatic screen, since magnetic field measurement is carried out in a torus outside of the primary conductor.

The Neel Effect® is very accurate. Neel Effect® is the name for the technology described in patent FR 2,891,917, based on the use of a coil and of a magnetic composite without remanence B(H) the third derivative of which at the origin has an extremum (for example a superparamagnetic composite). The Neel Effect® technology has low sensitivity to external fields owing to the low permeability of their magnetic material. They exist in a "universal" flexible form of the Rogowski type for measuring direct currents (patent FR 2,931,945). This topology has high immunity to cross-talk, being based on Ampere's law and measuring circulation of the magnetic field on a substantially closed external contour. This topology has the same advantages and drawbacks as the other technologies from the standpoint of integration: they are large because they have to surround the primary conductor and they have high electric power consumption in order to operate at zero flux.

Compact topologies have also been described for Neel Effect® sensors based on a measurement directly on a busbar or even inside a busbar, in order to allow a significant reduction in consumption despite operation at zero flux (French patent applications No. 1158584 and No. 1162100). However, with these topologies it is difficult to be able to ensure good withstand strength under voltage, in addition to adding an electrostatic screen and having high immunity to cross-talk.

French patent application No. 15 52694 is also known, which describes a compact topology of a Neel Effect® sensor based on the use of an IpHp conversion component and a field transducer consisting of two antiparallel-mounted differential pairs.

The aim of the present invention is to improve the existing Neel Effect® sensors by making them more compact and for use with a wide bandwidth.

A further aim of the present invention is to provide a current sensor allowing linear measurement and having low thermal drift over a wide frequency range.

SUMMARY

At least one of the objectives is achieved with a current sensor comprising at least one primary circuit intended to conduct the current to be measured, and a secondary circuit comprising at least four Neel Effect® transducers each constituted by a coil and a superparamagnetic core. According to the invention, the design of the current sensor is based on a printed circuit, the primary circuit comprising at least two distinct metal tracks constituted by one and the same metal and connected together by at least two vias constituted by the same metal as the metal tracks.

"Via" (or "vertical interconnect access") means an electrical connection between two layers of a printed circuit.

The two vias according to the invention in particular constitute respectively an input and an output of a uniform current distribution zone between the two vias.

The current sensor according to the invention makes it possible for measurements to be carried out linearly and with low thermal drift over an entire frequency range.

The invention makes it possible to carry out a conversion of the current to be measured to a magnetic field by optionally introducing a current splitting effect. For this it is possible to use:

metal tracks or conductive plates generating fields essentially orthogonal to the axes of the coils, which thus will not contribute to the measurement, and metal tracks or conductive plates generating fields essentially collinear with the axes of the coils, which will thus contribute to the measurement.

Thus a design capability is achieved for a current sensor allowing operation at zero flux including for very high levels of currents (>10 A, up to 100 A, or even 1000 A, or even 10 kA and above).

It is beneficial to use the printed circuit board manufacturing process for making these primary conductors, either with copper bars and inserts in PCBs, or directly in PCBs, or a combination of the two.

The benefit of said production according to the invention, which consists of using a solderless, in particularly coppered, metallic bond between the various primary bars, is to eliminate the concept of contact resistance, which introduces parasitic phenomena as a function of time (ageing) or temperature. Advantageously, this metal bond is produced without soldering, with for example bonds produced electrochemically.

In fact, when a current splitter is used, such as the two metal tracks according to the invention, in order to generate the magnetic field to be measured, it is necessary for the splitting ratio to be independent of the temperature and of the level of current. When the splitting ratio is temperature-dependent this introduces temperature gain drift. When the splitting ratio depends on the level of current, this introduces non-linearities.

The current sensor according to the invention makes it possible to measure DC and/or AC currents. Preferably, the Neel Effect® transducers are all substantially identical. The metal tracks are also all substantially identical.

In practice, and advantageously, the current sensor according to the invention may be used as a transducer connected to, and controlled by, a processing unit. Various types of connections and various types of measurement modes may be envisaged.

According to an advantageous feature of the invention, the primary circuit is a multilayer conductor of the printed circuit.

The invention improves the capacity for integration of the current sensor to give a reduced space requirement, and measurement is carried out directly in a printed circuit.

According to another advantageous feature of the invention, the Neel Effect® coils are solenoids wound round an elongated core, the whole being a component embedded in the printed circuit.

In order to further improve integration, a current sensor design is envisaged that is fully compatible with a printed circuit technology. For this purpose, it may be envisaged that each Neel Effect® transducer is a flat coil produced in the printed circuit. The assembly is arranged in one and the same printed circuit.

The core is a composite material constituted by nanoparticles of metal oxides dispersed in a rubbery or rigid thermoplastic matrix, the behaviour of said core thus constituted being superparamagnetic at the temperature of use.

The matrix is selected so as not to interfere with the magnetic properties of the nanoparticles. For example, the material of the matrix alone is solely diamagnetic. Preferably, the matrix is a thermosetting material (e.g. phenoplasts, aminoplasts, epoxy resins, saturated or unsaturated polyesters, linear or cross-linked polyurethanes, alkyds), elastomeric material (e.g. silicone or synthetic rubber) or thermoplastic material (e.g. polyvinyl materials, polyvinyl chlorides, polyvinyl acetates, polyvinyl alcohols, polystyrenes and copolymers, acrylic polymers, polyolefins, cellulose derivatives, polyamides, fluorinated polymers, polycarbonates, polyacetals, oxides of polyphenylenes, polysulphones, polyethersulphones, phenylene polysulphides, polyimides). For applications at very high temperature the matrix may also be produced from a ceramic material. Depending on the mechanical and thermal stresses acting on the core, the matrix may be reinforced, for example with glass fibres. The metal nanoparticles may be stabilized with a surfactant, chelating at its proximal end, such as a carboxylic fatty acid, for example oleic acid, or an alkyl bisphosphonate.

In a first embodiment, the core is prefabricated to the dimensions of a housing arranged in the thickness of the PCB. For example the housing is produced by moulding, or by piercing or machining of the PCB. The matrix may then be constituted by all the materials listed above and the composite may be prefabricated by the methods that are well known to a person skilled in the art.

In a second embodiment, the core is manufactured in situ in a housing produced in the PCB using the methods and equipment of the process known as "resin filling". From the list of all the materials given above for the matrix, a person skilled in the art will then select the materials that are compatible with the "resin filling" methods, for example the two-component resins or more generally those cross-linking under UV or with heat.

Preferably, each superparamagnetic core is composed of a matrix produced from epoxy resin.

Advantageously, the four Neel Effect® transducers may constitute two antiparallel-mounted differential pairs.

According to an advantageous embodiment of the invention, the current sensor further comprises at least one pair of transducers wound without magnetic cores with differential arrangement with respect to a single one of the two metal tracks.

Such a configuration makes it possible to carry out a combined DC and AC measurement in a very wide band. It is possible to reuse the other coils with a superparamagnetic core in order to carry out a high-frequency combined measurement. However, in order to improve the performance in terms of accuracy, at least two additional coils, substantially identical and with differential mounting, may advantageously be used. These coils do not comprise a superparamagnetic core and are located near a conductor that does not undergo the splitting effect.

According to the invention, the metal tracks may be of substantially identical widths produced on one and the same layer of a printed circuit. Moreover, the metal tracks may be of substantially identical thicknesses produced on several layers of a printed circuit.

The conductors are subject to the high-frequency skin effect, which deforms the lines of current and makes it difficult to measure alternating current (AC) unless using a conventional current transformer. By taking into account the width and thickness of the metal tracks according to the invention it is possible to carry out measurements with large variations of current dI/dt.

According to an advantageous embodiment of the invention, the metal tracks are tracks of a printed circuit produced so as to create a double-differential field distribution.

In particular, the primary circuit can be constituted by two metallic circuits produced on one or more layers, the shape of the second circuit being obtained by an operation of axial symmetry with respect to the first circuit.

According to an embodiment of the invention, the current sensor may comprise at least two primary circuits facing one another, each primary circuit being produced on a different layer of the printed circuit and constituted by several metal tracks, the Neel Effect® transducers being flat coils with a superparamagnetic core arranged between the two primary circuits. It may also comprise two electrostatic screens arranged respectively on layers between the Neel Effect® transducers and the primary circuits.

It may consist of interposing conducting circuit layers between the primary conductors and the measuring coils, respectively.

According to an embodiment of the invention, said at least two primary circuits are traversed by two different currents by being connected together at most at one end. This makes it possible to carry out differential measurement.

According to an embodiment of the invention, the metal tracks of the primary circuit may be designed in the form of turns arranged in series. It is then possible to measure smaller primary currents, of 10 A, or 1 A, or 0.1 A, or 10 mA, or even 1 mA or less.

According to the invention, each via may consist of a rivet, a tube or an electrolytic deposit.

According to another aspect of the invention, a method is proposed for producing a Neel Effect® transducer in a printed circuit, said method comprising the following steps:
producing a housing in the printed circuit,
inserting, in the housing, a core prefabricated to the dimensions of said housing,
producing the coil round the core.

A method may also be provided for making a Neel Effect® transducer in a printed circuit, said method comprising the following steps:
making a housing in the printed circuit using techniques known as "resin filling",
inserting a core, manufactured in situ, into the housing,
producing the coil round the core.

BRIEF DESCRIPTION OF THE DRAWINGS

Other advantages and features of the invention will become apparent on examination the detailed description of an embodiment that is in no way limitative, and from the attached drawings, in which:

FIG. 1bis is a diagrammatic view of a sensor according to the invention produced on a feed line 78 of a power inverter for example 78, the whole being integrated in a printed circuit, FIG. 6a shows a first primary layer that creates the double-differential field distribution in the axis of the flat coils; FIG. 6b shows the second primary layer with a splitter effect on the Neel measurement, which does not create a field in the axis of the Neel coils whereas there is no splitter effect on the Rogowski coils; FIG. 6c shows the four Neel coils at the bottom and the four air coils at the top.

DETAILED DESCRIPTION

The embodiments that will be described hereinafter are in no way limitative; variants of the invention can be implemented comprising only a selection of the characteristics described hereinafter, in isolation from the other characteristics described, if this selection of characteristics is sufficient to confer a technical advantage or to differentiate the invention with respect to the state of the prior art. This selection comprises at least one, preferably functional, characteristic without structural details, or with only a part of the structural details if this part alone is sufficient to confer a technical advantage or to differentiate the invention with respect to the state of the prior art.

In particular, all the variants and all the embodiments described can be combined together if there is no objection to this combination from a technical point of view.

Figure 1:
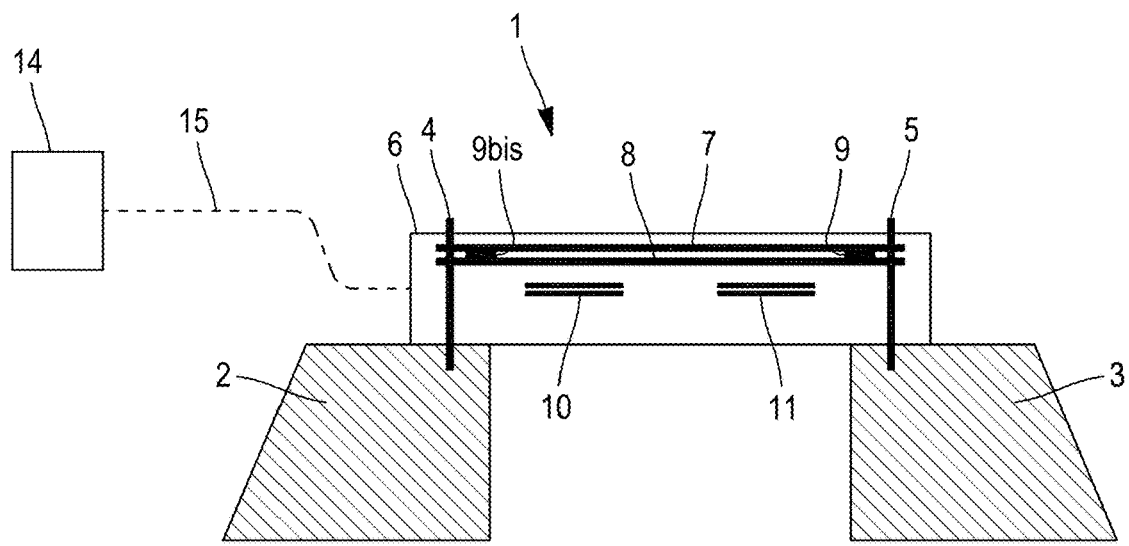
FIG. 1 is a diagrammatic view of the current sensor according to the invention connected to a conductor and linked to a processing unit.

FIG. 1 shows a cross section view of a current sensor 1 connected to two conductors 2 and 3. These conductors form part of an electric circuit through which a current to be measured passes. The current sensor according to the invention is used without any connector in a PCB that incorporates other electronic functions (such as an inverter for example), or else connected electrically to the conductors 2 and 3 by means of two detachable metal fasteners 4 and 5, which may be in the form of screws for example. The current sensor thereby constitutes a bridge allowing current to pass from one conductor to the other.

The current sensor 1 is constituted by a printed circuit 6 in which two metal tracks 7 and 8 are produced, constituting the primary circuit through which the current to be measured passes. These are two copper tracks produced in the printed circuit. They are identical, arranged on two different layers and connected together by printed circuit vias 9 and 9*bis*. These vias 9 and 9*bis* may be rivets, tubes or electrolytic deposits of the same metal as the two tracks, connecting them together electrically without soldering.

The dimensions of the metal tracks depend on the level of current. The higher the current, the larger the dimension of the metal tracks. However, it is envisaged to use current densities of approximately 5 A/mm$^2$ to 10 A/mm$^2$ without exceeding a current density of 20 A/mm$^2$. The width also depends on the number of layers and the thickness of copper available. For high currents (>100 A), a new design process called "PowerPCB" may be utilized, for which the track thicknesses reach 200 μm, or even 400 μm, or even 1 mm and beyond.

The Neel Effect transducers 10 and 11, i.e. coils with a superparamagnetic core are shown.

A processing unit 14 is provided remotely and connected to the current sensor by a measurement cable 15 for controlling the Neel Effect transducers and for determining the value of the current.

FIG. 1*bis* shows a current sensor 7, 8, 9, 9*bis*, 10, 11 according to the invention provided on a feed line 7, 8 of a power inverter 78, the whole being integrated in a printed circuit. In this example, the feed line of the integrated inverter is used advantageously for producing a second track and vias. The transducers 10 and 11 make it possible to detect the magnetic field, for deducing the current therefrom.

Only two coils 10 and 11 are shown, but two others 12 and 13 are located on the same layer of the printed circuit in the depth. The four coils are flat coils, seen in top view in FIG. 2. The metal track 7 is shown diagrammatically above the four coils 10, 11, 12 and 13 and carries a measuring current Ip.

Figure 2:
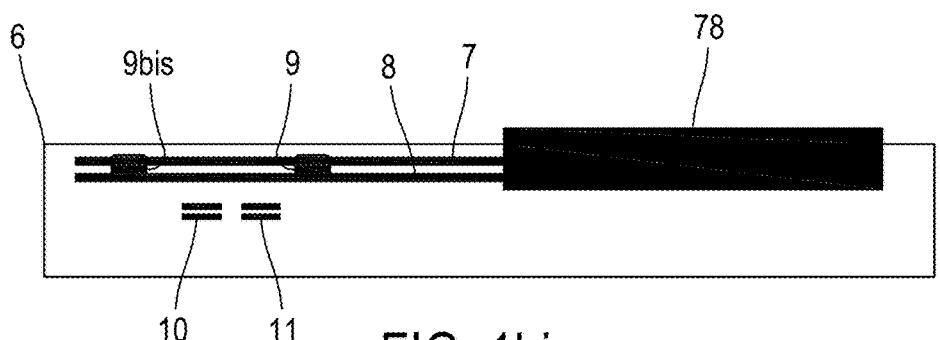
FIG. 2 is a top view of the current sensor according to the invention in a differential measurement configuration, with the primary current circulating in the primary conductor.
Figure 2:
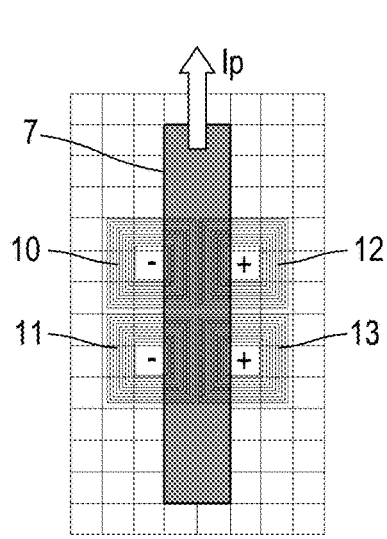

The four coils are all substantially identical in order to allow better rejection of the interferences. A purely differential configuration can be envisaged as shown in FIG. 2 so as to allow measurement on a conventional copper bar. In this configuration, the magnetic field is the same in the two right-hand coils 10 and 11, and opposite in the two left-hand coils 12 and 13. The metal tracks do not cover the cores of the coils, which are thus arranged on either side.

The superparamagnetic material is placed in a cavity within the flat coils.

With regard to the material, two design options may be considered:
- a core is inserted in the printed circuit based on a principle of "PCB embedded" component, and in this case the matrix of the core would be either composite of the epoxy resin, ceramic or other type,
- the core is added into the printed circuit by a method of the "resin fill" type, which consists of including the material directly in a design process of the conventional printed circuit. In this case the matrix of the core would be either of epoxy or other resin.

Figure 3:
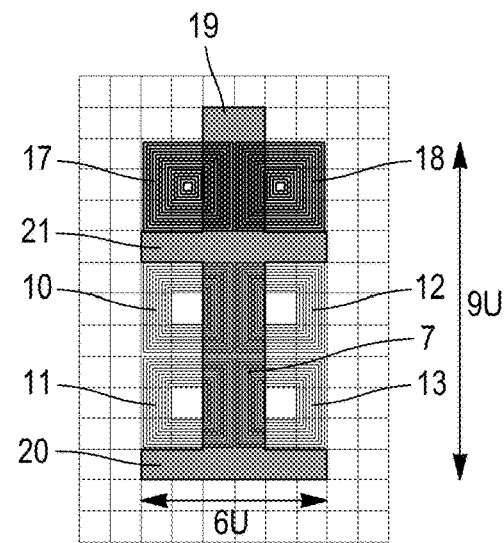
FIG. 3 shows an example of wide-band configuration with four coils with a superparamagnetic core and two careless coils for AC measurement.

It is possible to reuse the four aforementioned coils for carrying out a high-frequency combined measurement. However, in order to improve the performance in terms of accuracy, at least two additional coils 17 and 18 may advantageously be used, substantially identical and with differential mounting. These coils do not comprise a superparamagnetic core and are located near a conductor 19 that is not subject to the splitting effect. An example of a nonlimitative solution is shown in FIG. 3.

This shows the four coils with a superparamagnetic core 10-13 in the same configuration as in FIG. 2, with a primary circuit with two tracks, only track 7 of which is shown. Connecting means 20 and 21 correspond to the vias 9 and 9*bis* in order to ensure good distribution of the current between the layers.

The single conductor 19 completes the primary circuit conducting the current to be measured. This conductor 19 is connected to the assembly of the two tracks 7 and 8. In particular it may be a question of the continuity of one of the two tracks. The conductors 2 and 3 will therefore be connected respectively on the one hand to the conductor 19 and on the other hand to the two tracks 7 and 8.

Figure 4:
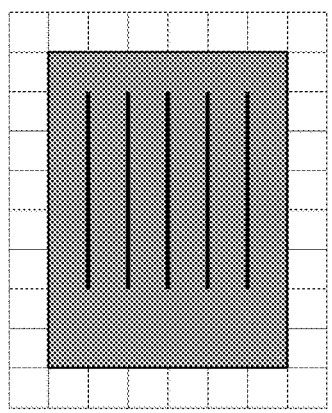
FIG. 4 shows an example of a full layer for which the conductor is composed of tracks of a printed circuit, grooved in order to improve the bandwidth of the current sensor according to the invention.

In an advantageous configuration of the solution, and in particular in order to reduce the skin effect phenomena, which may reduce the bandwidth of the sensor, the primary circuit or conductor is composed of several printed circuit tracks of the same width and the same thickness. These tracks may then be placed parallel to one another on one and the same layer of printed circuit as shown in FIG. 4, or else superposed on several layers, or else both; for each track it is necessary to provide a second track, to which it is connected by means of at least two vias.

Figure 5A:
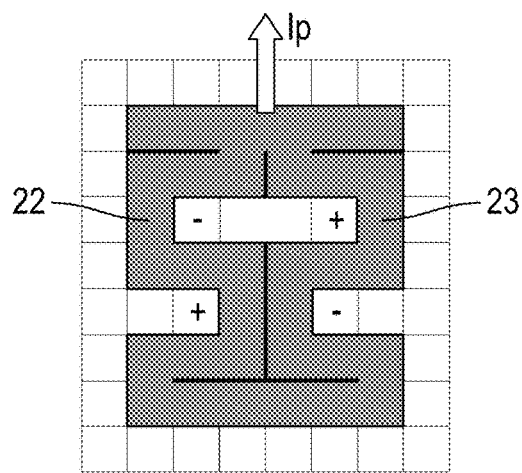
FIGS. 5a and 5b show an example of a single-layer double-differential structure, FIG. 5a showing the primary conductor and FIG. 5b the measuring coils.
Figure 5B:
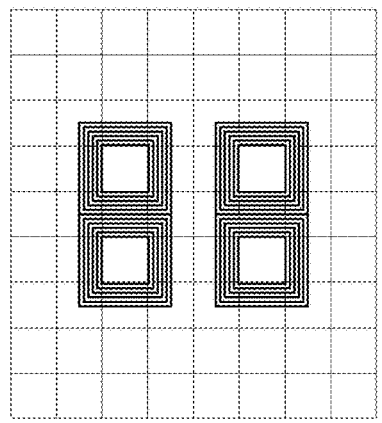

In order to provide effective rejection of the external fields, a double-differential structure may advantageously be used in order to improve the rejection of the external fields. In this case, the shape of the primary conductor is adapted in order to generate a field distribution compatible with the double-differential structure and measuring coils of flat shape for example. An embodiment example is shown in FIGS. 5*a* and 5*b*. In FIG. 5*a*, the primary circuit is constituted by two metal circuits 22 and 23 produced on one and the same layer, the shape of the second circuit 23 being obtained by an operation of axial symmetry with respect to the first circuit 22. As an example, the circuit in FIG. 4 may advantageously serve as second tracks connected to the circuits in FIG. 5*a* by vias, the circles in the two figures.

In the present case, the first metal circuit 22 has an overall coiled or "S" shape, and the combination of the first and second metal circuits 22 and 23 reveals zones that are not covered in the printed circuit. These zones are indicated with "+" and "−" signs representing the orientation and positioning of the axes of the magnetic fields created by coils with a superparamagnetic core arranged on another layer of the printed circuit. These coils are shown in FIG. 5*b* and constitute two antiparallel-mounted differential pairs.

This topology may advantageously be used for Neel Effect® and Rogowski measurements, with eight flat coils, four of which are loaded with superparamagnetic cores and four with air (without superparamagnetic core).

Figure 6A:
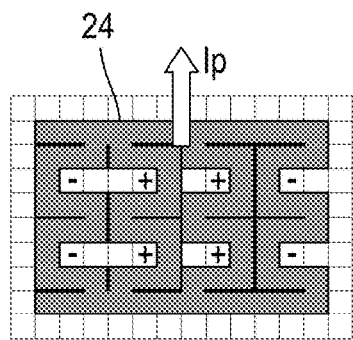
FIGS. 6a, 6b and 6c show an example of a DC and AC wide-band structure.
Figure 6B:
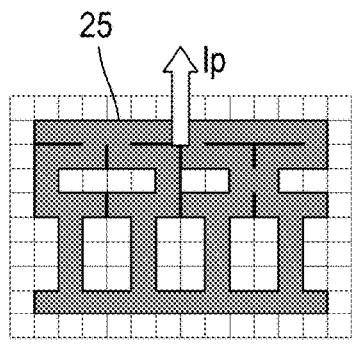
Figure 6C:
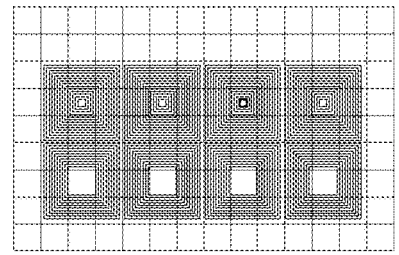

Preferably, a splitter effect is not used at the level of the air coils, in order to improve the bandwidth and sensitivity. A very wide band DC and AC embodiment example is shown in FIGS. 6*a*, 6*b* and 6*c*. FIG. 6*a* shows a first primary layer 24, which creates the double-differential field distribution in the axis of the flat coils. This first layer is constituted by four metal circuits, which are symmetrical in pairs.

FIG. 6*b* shows a second primary layer 25 with a splitter effect on the Neel measurement, which does not create a field in the axis of the coils with superparamagnetic core, whereas there is no splitter effect for the Rogowski (air) coils. This second layer is constituted by four metal circuits that are symmetrical in pairs.

In FIGS. 6*a* and 6*b*, the vias allowing distribution of the current between the two layers are the small circles distributed over the two layers.

In FIG. 6*c*, the four coils with superparamagnetic core are at the bottom and the four air coils are at the top.

Figure 7:
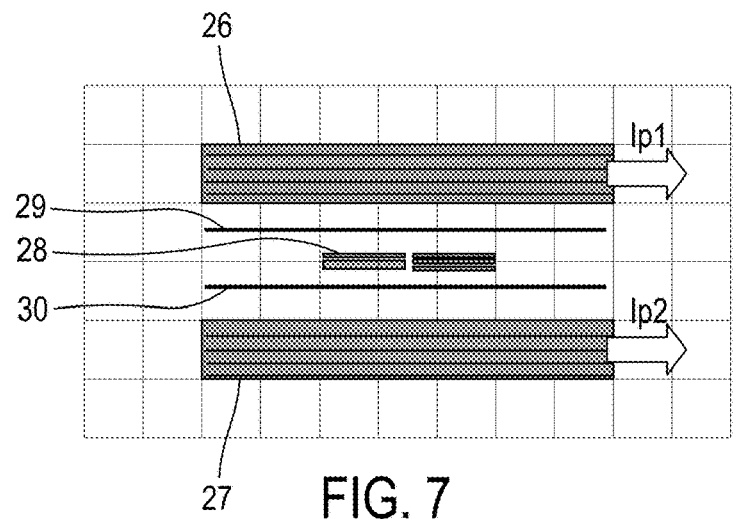
FIG. 7 is a side view of a quadrupolar sensor comprising electrostatic screens according to the invention.

According to the invention, the primary conductor may advantageously be constituted by several poles in order to produce a sensor that is more linear or differential. For example, in FIG. 7, a first positive pole 26 situated in a plane above that of the measuring coils 28 and a second negative pole 27 situated in a plane below that of the measuring coils. The thickness of the insulating material placed between the primary poles 26, 27 and the measuring coils 28 may be adjusted as a function of the required insulation voltage. This thickness may advantageously be constituted by dielectric layers in order to improve the withstand strength under voltage. A conductive layer 29, 30 may also advantageously be introduced between the primary poles 26, 27 and the coils 28 in order to provide an electrostatic screen of the Faraday cage type. Thus, FIG. 7 shows a quadrupolar configuration with two currents Ip1 and Ip2 and two electrostatic screens 29 and 30. The sensor may be designed in such a way that the magnetic fields generated by the currents Ip1 and Ip2 at the levels of the measuring coils are constructive or destructive. A decision may thus be taken to make a common- or differential-mode current sensor. In an advantageous combination, the constructive combination may be used in order to improve the linearity of the sensor. In fact, the uniformity of the field is improved in the measuring coils, and this allows the linearity of the sensor to be improved. In this combination, other vias are then used for connecting the conductors of the poles 26 and 27. In another advantageous combination, the EMFs may be measured simultaneously at the terminals of the air coils connected in common or differential mode in order to constitute a "2 in 1" sensor, which measures the alternating component of the common-mode and differential-mode primary current.

Figure 8:
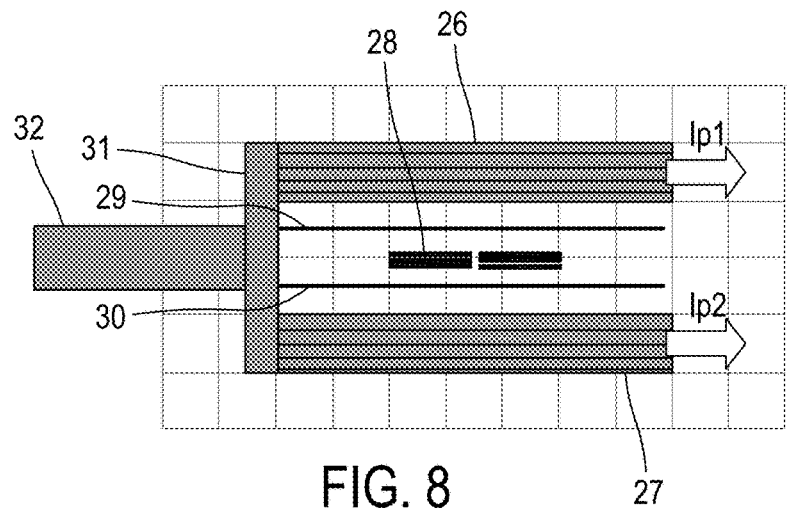
FIG. 8 is a view of the sensor in FIG. 7 with a connection of the metal circuits at one end so as to form a three-pole sensor.

In FIG. 8, two ends of the circuits 26 and 27 are connected together by means of the via 31, so as to constitute at least three poles, 26, 27 and 32 (metal track) and allow differential and/or common-mode measurement.

Figure 9:
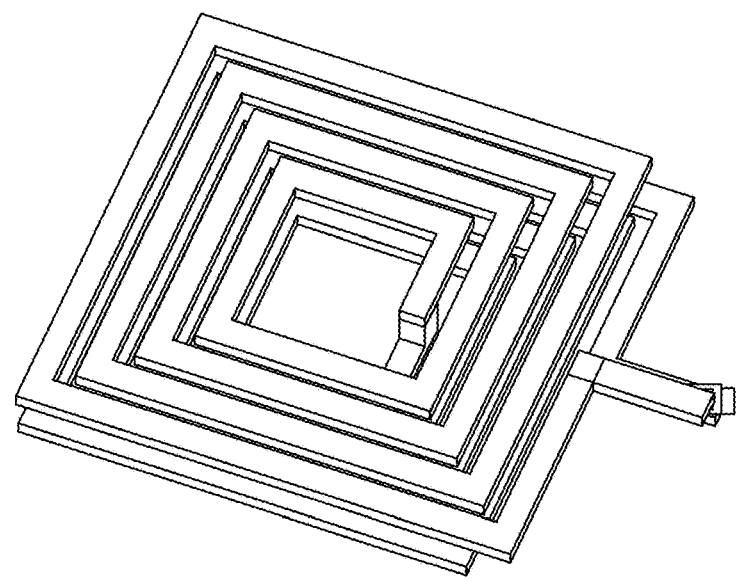
FIG. 9 is a diagrammatic representation of two flat coils on two different layers and connected in series.

The above principle may be adapted for measuring an isolated potential difference. For this, a principle is used that consists of diverting a small current via a resistor with high resistance and via a current sensor according to the invention. It is then advantageous to use the primary circuit to constitute a large number of turns placed in series and not in parallel in order to amplify (intensify) the magnetic field to be measured in the coils. A configuration of the turns in series is shown in FIG. 9. The field at the centre of the coil is proportional to the current multiplied by the number of turns/layers and multiplied by the number of layers.

Of course, the invention is not limited to the examples that have just been described, and numerous adjustments may be made to these examples without exceeding the scope of the invention. The current sensor according to the invention may be integrated completely in a printed circuit and may be used for measuring a current of an electronic device, also produced in the printed circuit. For example, the electronic device may be an inverter produced on a printed circuit, the current sensor according to the invention being designed on the basis of two tracks from an output of one phase of the inverter. The current sensor according to the invention may be designed on the basis of two metal tracks of any supply circuit of a printed circuit.

The invention claimed is:

1. A current sensor comprising: at least one primary circuit intended to conduct the current to be measured, and a secondary circuit comprising at least four Neel Effect® transducers each constituted by a coil and a superparamagnetic core, said sensor is designed on the basis of a printed circuit, the primary circuit comprising at least two distinct metal tracks composed of one and the same metal and connected together by at least two vias constituted by the same metal as the metal tracks.

2. The sensor according to claim 1, characterized in that the primary circuit is a multilayer conductor of the printed circuit.

3. The sensor according to claim 1, characterized in that the Neel Effect® coils are solenoids wound round an elongated core, the whole being a component embedded in the printed circuit.

4. The sensor according to claim 1, characterized in that each Neel Effect® transducer is a flat coil produced in the printed circuit.

5. The sensor according to claim 1, characterized in that each superparamagnetic core is composed of a matrix produced from epoxy resin.

6. The sensor according to claim 1, characterized in that the four Neel Effect® transducers constitute two antiparallel-mounted differential pairs.

7. The sensor according to claim 1, characterized in that it further comprises at least one pair of transducers wound without magnetic cores with differential arrangement with respect to a single one of the two metal tracks.

8. The sensor according to claim 1, characterized in that the metal tracks are of substantially identical widths produced on one and the same layer of a printed circuit.

9. The sensor according to claim 1, characterized in that the metal tracks are of substantially identical thicknesses produced on several layers of a printed circuit.

10. The sensor according to claim 1, characterized in that the metal tracks are tracks of a printed circuit produced so as to create a double-differential field distribution.

11. The sensor according to claim 10, characterized in that the primary circuit is constituted by two metal circuits produced on one or more layers, the shape of the second circuit being obtained by an operation of axial symmetry with respect to the first circuit.

12. The sensor according to claim 1, characterized in that it comprises at least two primary circuits facing one another, each primary circuit being produced on a different layer of the printed circuit and consisting of several metal tracks, the Neel Effect® transducers being flat coils with a superparamagnetic core arranged between the two primary circuits; and in that it further comprises two electrostatic screens arranged respectively on layers between the Neel Effect® transducers and the primary circuits.

13. The sensor according to claim 12, characterized in that said at least two primary circuits are connected together at one end.

14. The sensor according to claim 1, characterized in that the metal tracks of the primary circuit are designed in the form of turns arranged in series.

15. The sensor according to claim 1, characterized in that each via consists of a rivet, a tube or an electrolytic deposit.

16. A method for producing, in a printed circuit, a Neel Effect® transducer of the secondary circuit of a current sensor according to claim 1, said method comprising the following steps:
producing a housing in the printed circuit;
inserting, in the housing, a core prefabricated to the dimensions of said housing; and
producing the coil round the core.

17. A method for making a Neel Effect® transducer in a printed circuit, said method comprising the following steps:
producing a housing in the printed circuit using techniques known as "resin filling";

inserting a primary circuit into the housing, the primary circuit comprising at least two distinct metal tracks connected together by at least two vias; and inserting a secondary circuit including a core, fabricated in situ, into the housing; and producing the coil round the core.

\* \* \* \* \*